United States Patent
Su et al.

(10) Patent No.: US 12,283,778 B2
(45) Date of Patent: Apr. 22, 2025

(54) SHIELD SOCKET FOR A COMPUTING CARD OF AN INFORMATION HANDLING SYSTEM

(71) Applicant: Dell Products L.P., Round Rock, TX (US)

(72) Inventors: Wen-Chien Su, Taipei (TW); Chih-Wei Chang, Taipei (TW)

(73) Assignee: Dell Products L.P., Round Rock, TX (US)

( * ) Notice: Subject to any disclaimer, the term of this patent is extended or adjusted under 35 U.S.C. 154(b) by 489 days.

(21) Appl. No.: 17/811,135

(22) Filed: Jul. 7, 2022

(65) Prior Publication Data
US 2024/0014608 A1    Jan. 11, 2024

(51) Int. Cl.
| H01R 13/6597 | (2011.01) |
| H01R 12/72 | (2011.01) |
| H01R 12/73 | (2011.01) |

(52) U.S. Cl.
CPC ......... *H01R 13/6597* (2013.01); *H01R 12/72* (2013.01); *H01R 12/73* (2013.01)

(58) Field of Classification Search
CPC .... H01R 13/6597; H01R 12/72; H01R 12/73; H05K 9/0018
See application file for complete search history.

(56) References Cited

U.S. PATENT DOCUMENTS 9,882,317 B1 *  1/2018  Lane ..................... H01R 24/20

FOREIGN PATENT DOCUMENTS

| CN | 104094474 A | * | 10/2014 | ......... H01R 12/7082 |
| CN | 104752903 B | * | 1/2018 | ......... H01R 13/5202 |
| WO | WO-2020052318 A1 | * | 3/2020 | ........... H01R 12/716 |

* cited by examiner

*Primary Examiner* — Jean F Duverne
(74) *Attorney, Agent, or Firm* — McDermott Will & Emery LLP

(57) ABSTRACT

A RF shielding socket, including a first tab shield portion on a first side of the socket; a second tab shield portion on a second side of the socket; an extension shield portion extending along a first direction between the first tab shield portion and the second tab shield portion, the extension shield portion including a plurality of clips, each of the clips protruding from the extension shield portion in a second direction traverse to the first direction; a plurality of pins positioned on a third side of the socket, the third side extending between the first side and the second side, a subset of the plurality of pins include a tabbed feature protruding from a body of the respective pin, wherein the tabbed feature of each of the subset of the plurality of pins is in contact with at least one of the clips of the plurality of clips.

18 Claims, 9 Drawing Sheets

SHIELD SOCKET FOR A COMPUTING CARD OF AN INFORMATION HANDLING SYSTEM

BACKGROUND

Field of the Disclosure

The disclosure relates generally to an information handling system, and in particular, a shield socket for a computing card of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a radio frequency (RF) shielding socket, including a first tab shield portion on a first side of the socket; a second tab shield portion on a second side of the socket, the second side opposite the first side; an extension shield portion extending along a first direction between the first tab shield portion and the second tab shield portion, the extension shield portion including a plurality of clips, each of the clips protruding from the extension shield portion in a second direction traverse to the first direction; and a plurality of pins positioned on a third side of the socket, the third side extending between the first side and the second side, wherein a subset of the plurality of pins include a tabbed feature protruding from a body of the respective pin, wherein the tabbed feature of each of the subset of the plurality of pins is in contact with at least one of the clips of the plurality of clips.

Other embodiments of these aspects include corresponding systems and apparatus.

These and other embodiments may each optionally include one or more of the following features. For instance, each of the first tab shield portion and the second tab shield portion are coupled to a printed circuit board (PCB). Each clip of the plurality of clips includes two prongs. Each of the prongs is in contact with the tabbed feature of a single pin of the subset of the plurality of pins. Each prong of the two prongs is in contact with the tabbed feature of a respective pin of the subset of the plurality of pins. Each of the prongs includes a protrusion, wherein the protrusions of the prongs is in contact with the tabbed feature of the pin of the subset of the plurality of pins. The first tab shield portion, the second tab shield portion, and the extension shield portion are formed of conductive material. The first tab shield portion and the second tab shield portion are spring members. The socket provides grounding to a computing card when the computing card is coupled with the socket.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
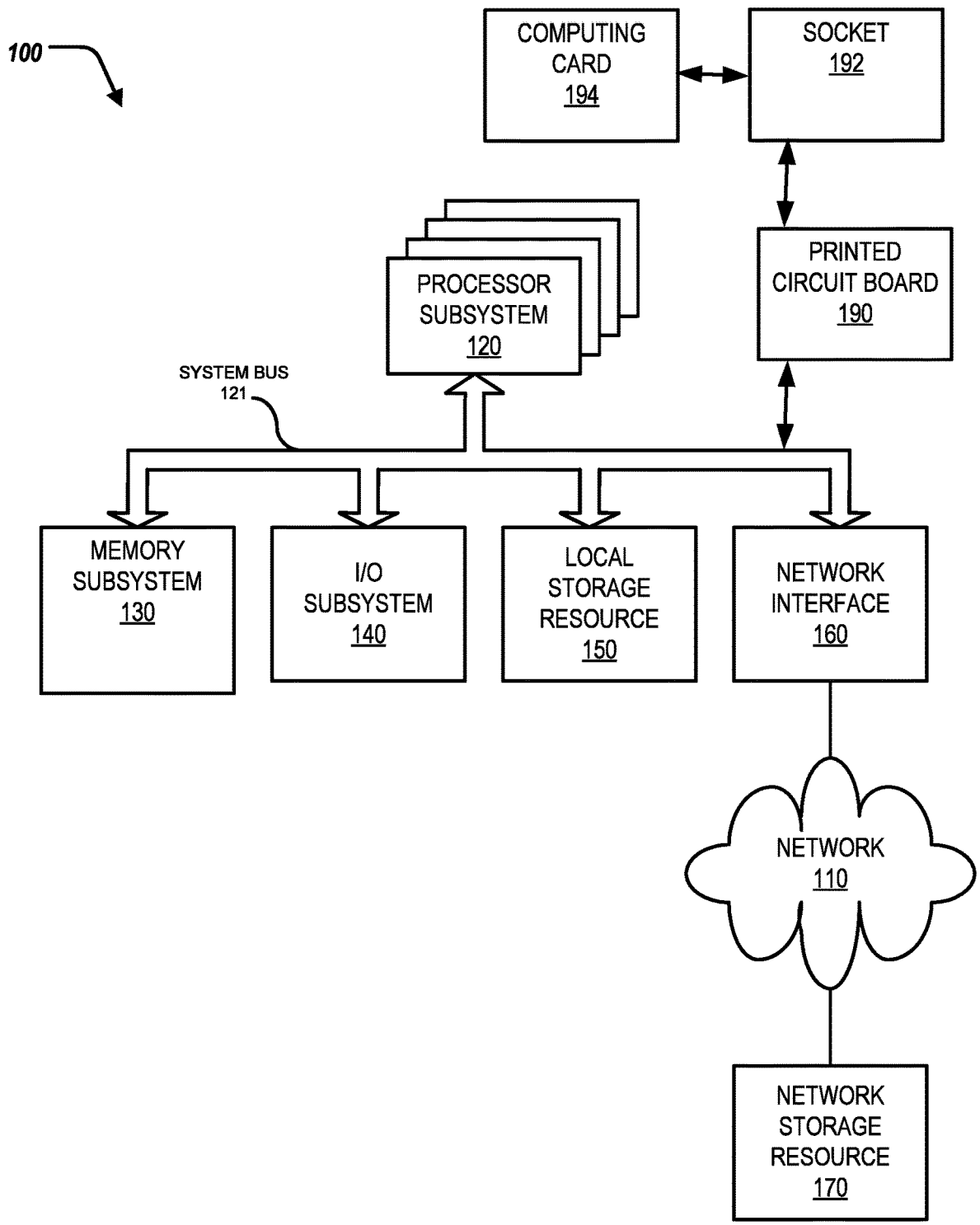
FIG. 1 is a block diagram of selected elements of an embodiment of an information handling system.

This disclosure discusses a shield socket for a computing card of an information handling system. In short, a socket can serve as a radio frequency (RF) shield for a computing card to reduce and/or minimize generated RF at the computing card (e.g., generated by a high-speed memory bus).

Specifically, this disclosure discusses a radio frequency (RF) shielding socket, including a first tab shield portion on a first side of the socket; a second tab shield portion on a second side of the socket, the second side opposite the first side; an extension shield portion extending along a first direction between the first tab shield portion and the second tab shield portion, the extension shield portion including a plurality of clips, each of the clips protruding from the extension shield portion in a second direction traverse to the first direction; and a plurality of pins positioned on a third side of the socket, the third side extending between the first side and the second side, wherein a subset of the plurality of pins include a tabbed feature protruding from a body of the respective pin, wherein the tabbed feature of each of the subset of the plurality of pins is in contact with at least one of the clips of the plurality of clips.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-9 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can also include a printed circuit board (PCB) 190, a socket 192, and a computing card 194. The socket 192 can be coupled to the PCB 190. The computing card 194 can be coupled to the socket 192.

In short, the socket 192 can serve as a radio frequency (RF) shield for the computing card 194 to reduce and/or minimize the generated RF at the computing card 194 (e.g., generated by a high-speed memory bus such as system bus 121).

Figure 2:
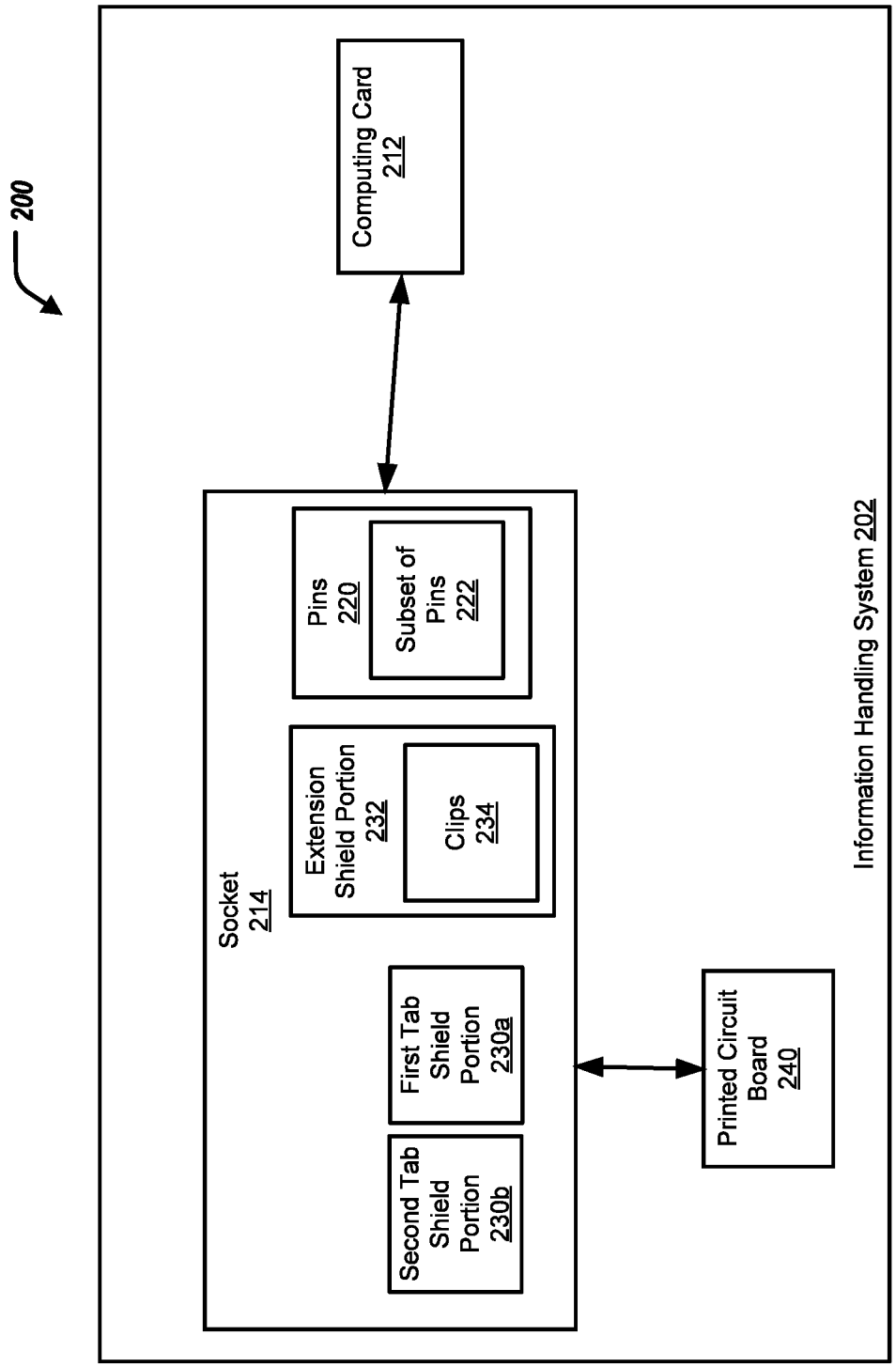
FIG. 2 illustrates a block diagram of the information handling system.

Turning to FIG. 2, FIG. 2 illustrates an environment 200 including an information handling system 202. The information handling system 202 can include a computing card 212, a radio frequency (RF) shielding socket 214 (or socket 214), and a printed circuit board 240. The socket 214 can include a plurality of pins 220. The plurality of pins 220 can include a subset of pins 222. The socket 214 can further include a first tab shield portion 230a and a second tab shield portion 230b (collectively referred to as tab shield portions 230). The socket 214 can further include an extension shield portion 232. The extension shield portion 232 can include a plurality of clips 234. In some examples, the information handling system 202 is similar to, or includes, the information handling system 100 of FIG. 1. In some examples, the information handling system 202 is the same, or substantially the same, as the information handling system 100 of FIG. 1. In some examples, the computing card 212 is the same, or substantially the same, as the computing card 194 of FIG. 1. In some examples, the socket 214 is the same, or substantially the same, as the socket 192 of FIG. 1.

The computing card 212 is couplable or engageable with the socket 214.

The socket 214 can be coupled to a printed circuit board (PCB) 240. In some examples, the PCB 240 is the same, or substantially the same, as the PCB 190 of FIG. 1.

Figure 3:
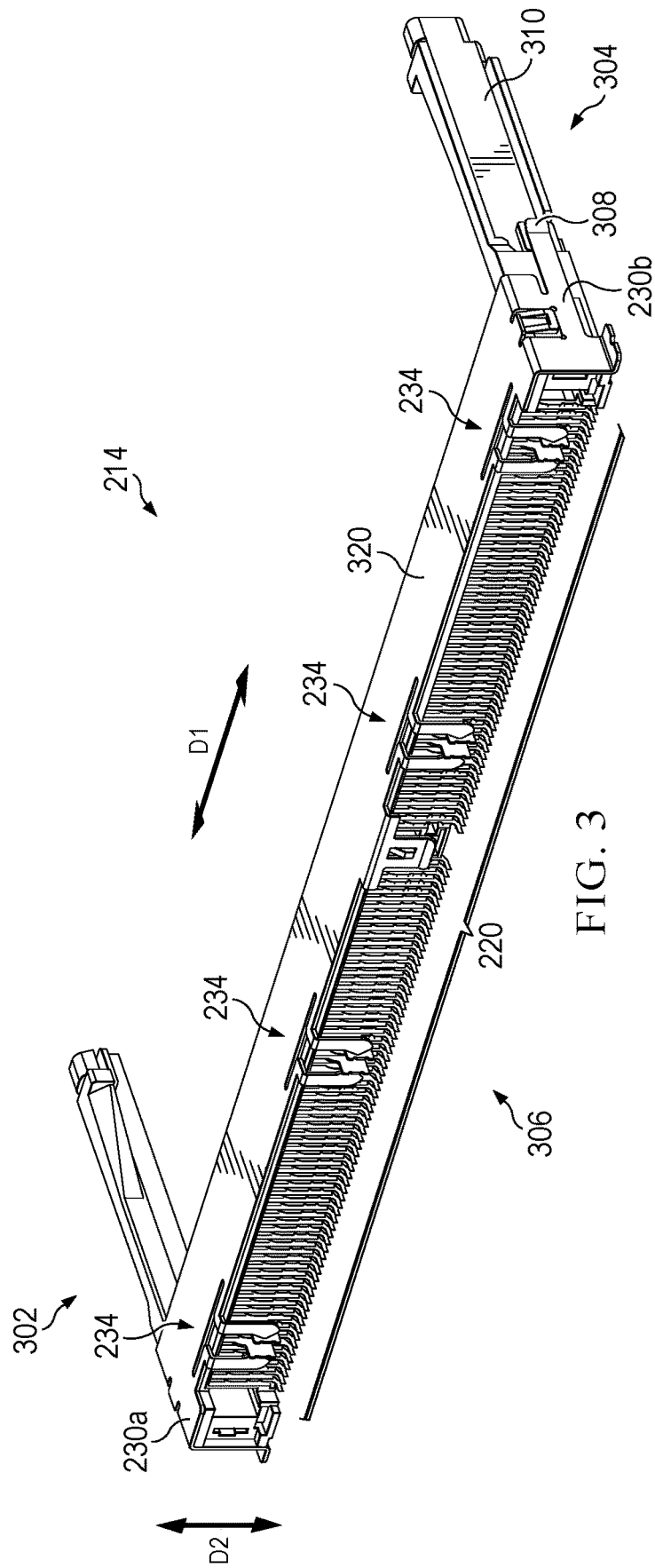
FIG. 3 illustrates a perspective view of a socket of the information handling system.
Figure 4:
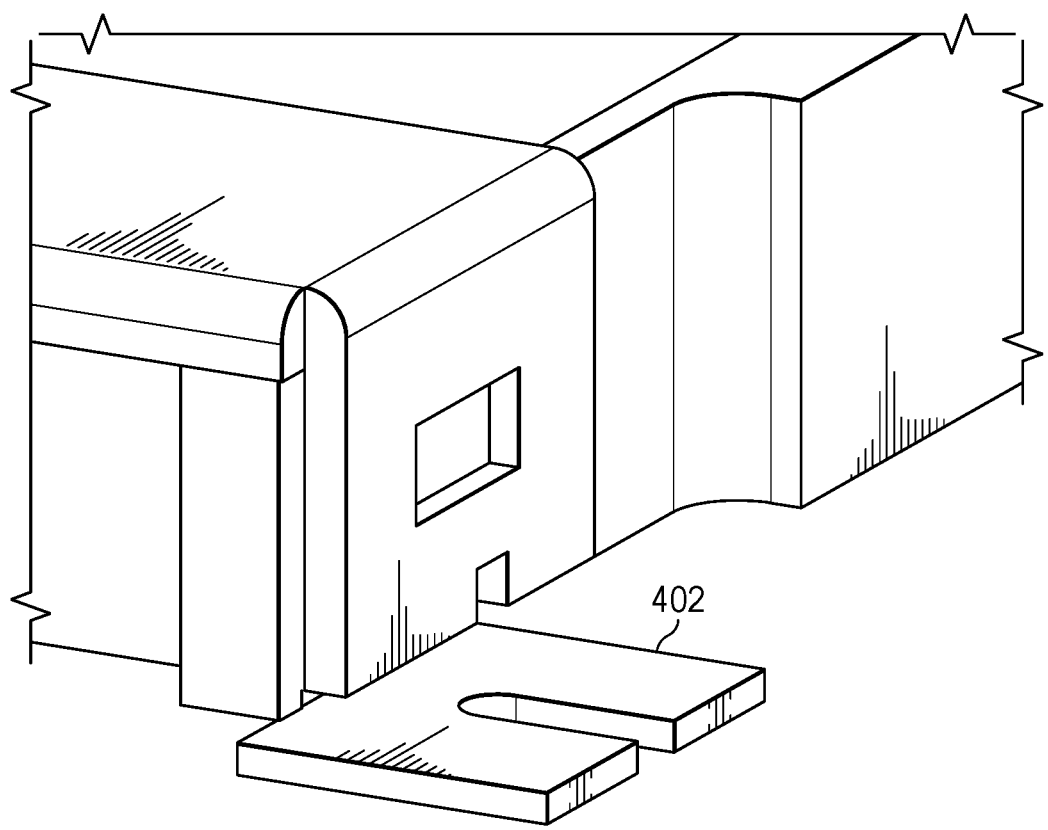
FIG. 4 is a perspective view of a solder pad of a tab shield portion of the shield.

Referring to FIG. 3, the socket 214 can include a first side 302 and a second side 304. The second side 304 is positioned opposite to the first side 302. The socket 214 can further include a third side 306 that extends between the first side 302 and the second side 304. The first tab shield portion 230a is positioned on the first side 302 of the socket 214. The second tab shield portion 230b is positioned on the second side 304 on the socket 214. The tab shield portions 230 can each include a solder pad 402, as shown in FIG. 4. Each of the tab shield portions 230 can be coupled to the PCB 240, and specifically, the solder pad 402 of each tab shield portion 230 can be coupled to the PCB 240 (e.g., via soldering). In some examples, each of the tab shield portions 230 are formed of metal, or other conductive material. In some examples, each of the tab shield portions 230 are spring members, or include spring members 308. The spring members 308 can contact respective conductive side portions 310 positioned on each of the first side 302 an the second side 304.

The socket 214 can further include an extension shield portion 320 extending along a first direction D1 between the first tab portion 230a and the second tab portion 230b. The extension shield portion 320 can be formed from metal, or other conductive material.

Figure 5:
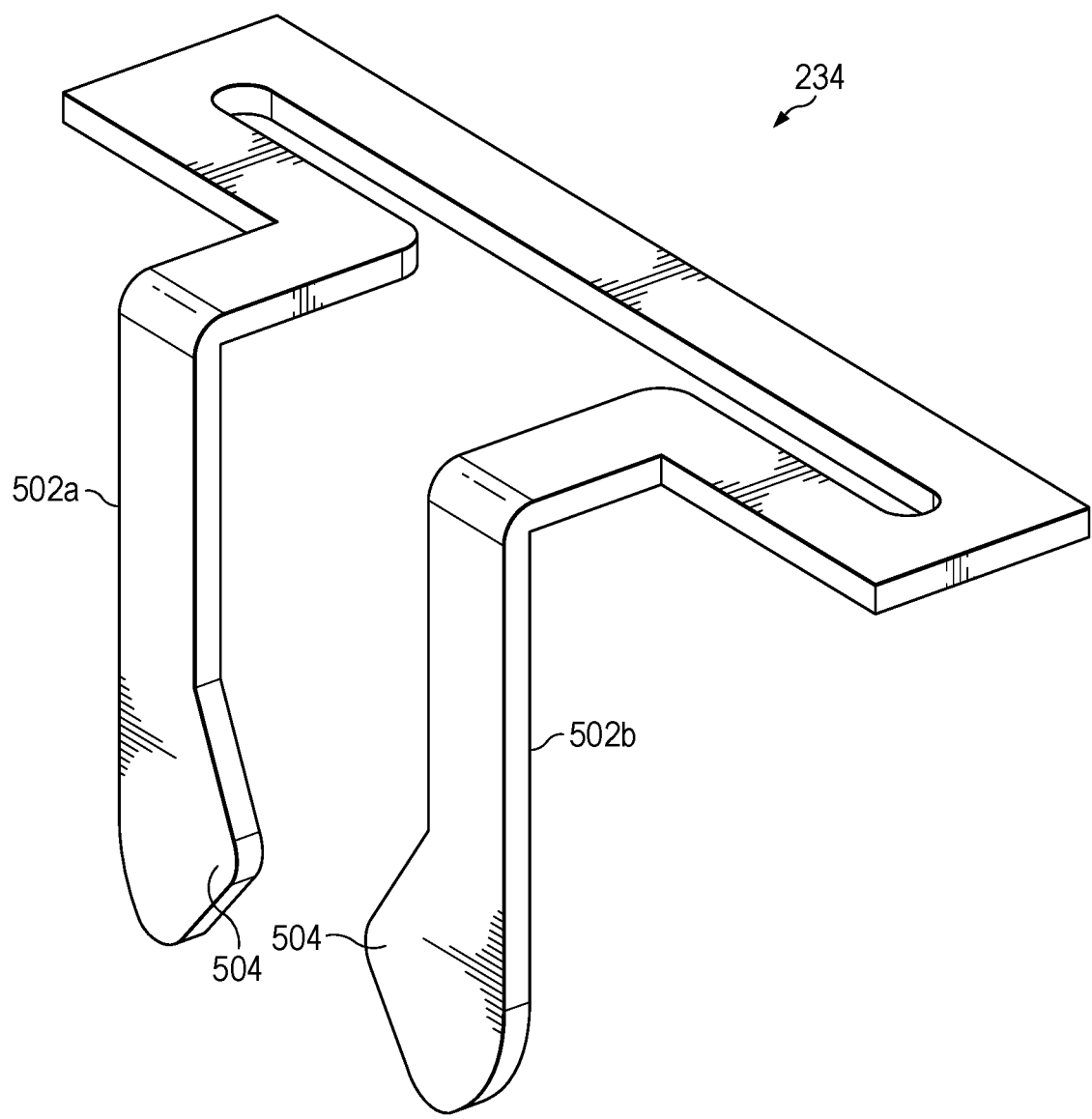
FIG. 5 is a perspective view of clips of the socket.

Referring to FIGS. 3 and 5, the extension shield portion 320 include a plurality of clips 234 (or clip structures 234). Each of the clips 234 protrudes from the extension shield portion 320 along a second direction D2 traverse to the first direction D1. That is, the clips 234 protrude from the extension shield portion 320 and extend along the third side 306 of the socket 214. In some examples, the clips 234 include a first prong 502a and a second prong 502b (collectively referred to as prongs 502). In some examples, the clips 234 only include a single prong. In some examples, a first subset of the clips 234 include a single prong and a second subset of the clips 234 includes two prongs. Each of the prongs 502 can further include a respective protrusion 504.

Figure 6:
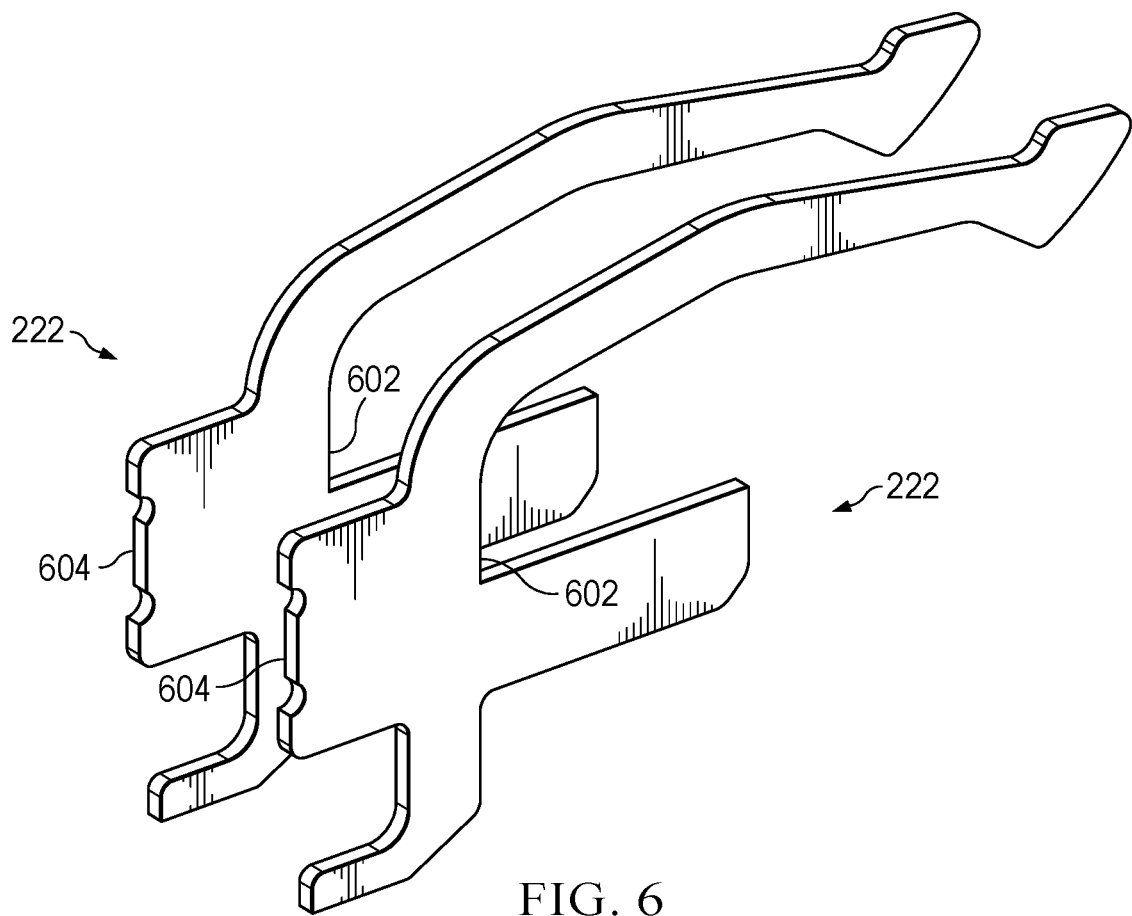
FIG. 6 is a perspective view of pins of the socket.

Referring to FIGS. 3 and 6, the socket 214 can include the plurality of pins 220 on the third side 306 of the socket 214. The subset of pins 222 of the plurality of pins 220 can include a body 602, and a tabbed feature 604 extending from the body 602. The pins 222 can be ground pins (VSS GRND).

Referring to FIGS. 3, 5, and 6, the tabbed feature 604 of each of the subset of pins 222 is in contact with at least one of the clips 234. That is, the clips 234 and the pins 222 are aligned such that the tabbed feature 604 of each of the subset of pins 222 is in contact with at least one of the clips 234. In particular, the protrusions 504 of the prongs 502 are in contact with the tabbed feature 604 of the pins of the subset of the pins 222.

Figure 7:
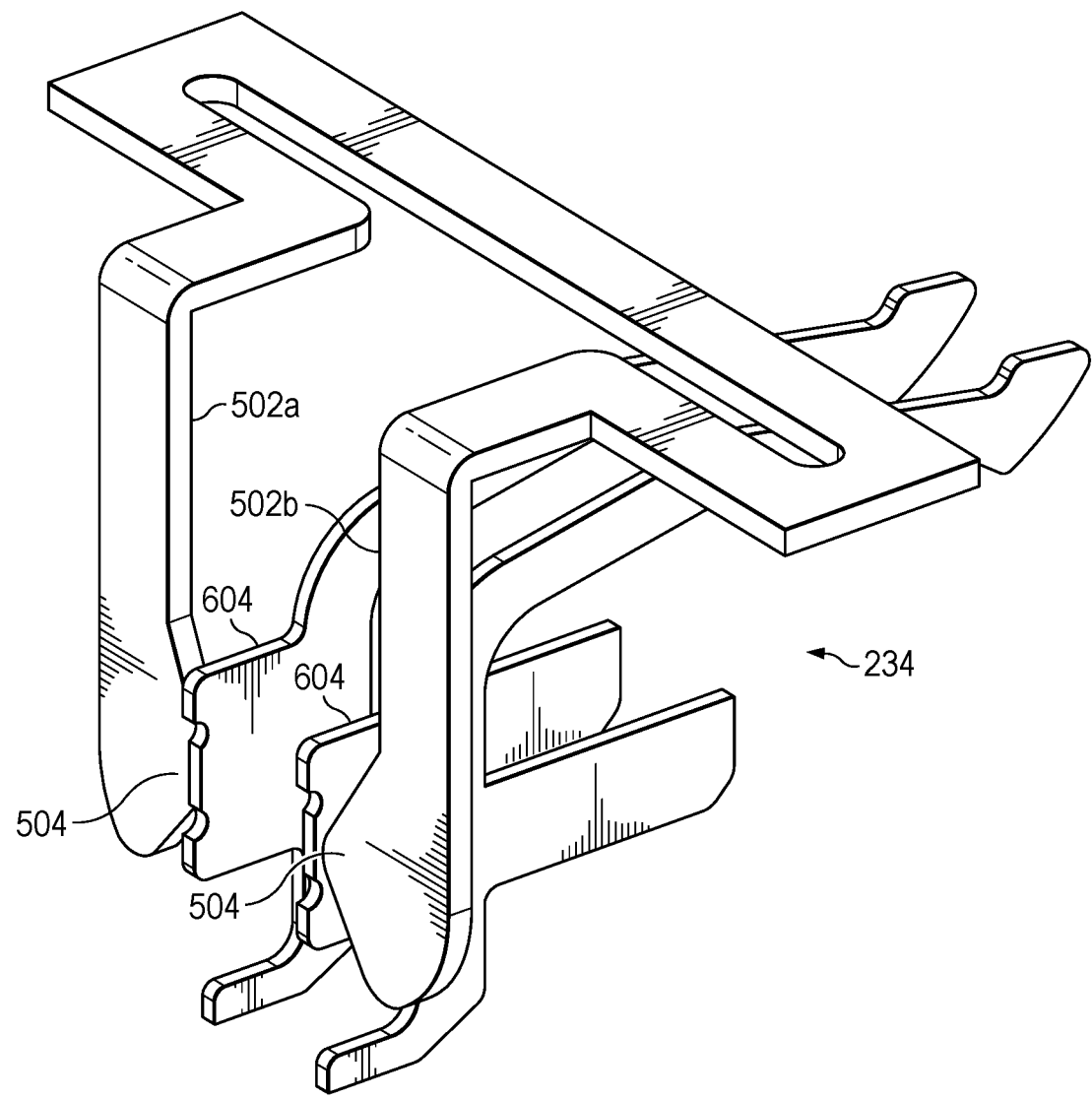
FIGS. 7, 8 are respective perspective view of the pins in contact with the clips.

In some examples, each of the prongs 502 is in contact with the tabbed feature 604 of a respective pin 222 of the subset of pins 222, as shown in FIG. 7. In some examples, the respective pins 222 are adjacent to one another.

Figure 8:
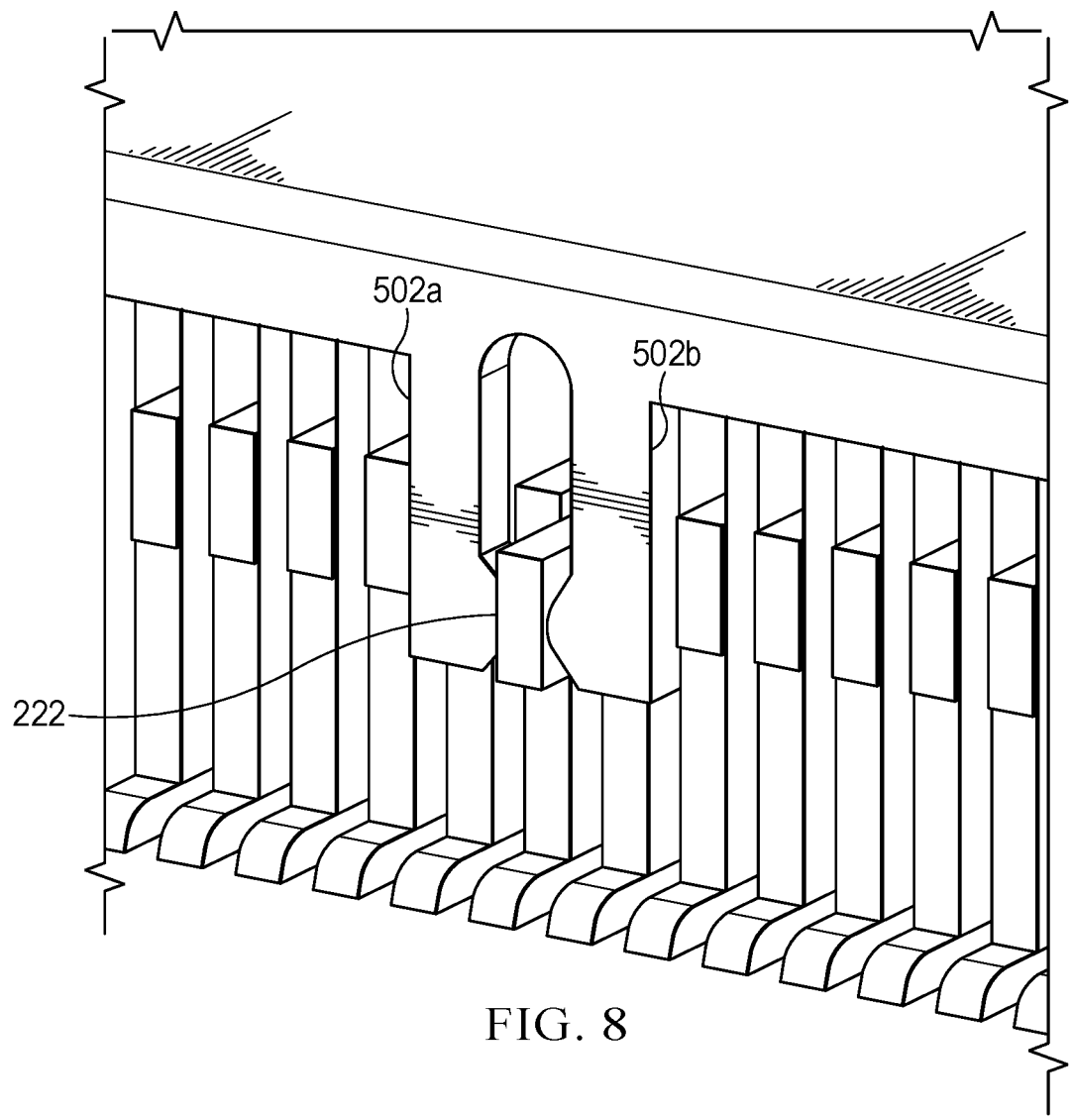

In some examples, each of the prongs 502 is in contact with the tabbed feature 604 of a single pin 222 of the subset of pins 222, as shown in FIG. 8.

Figure 9:
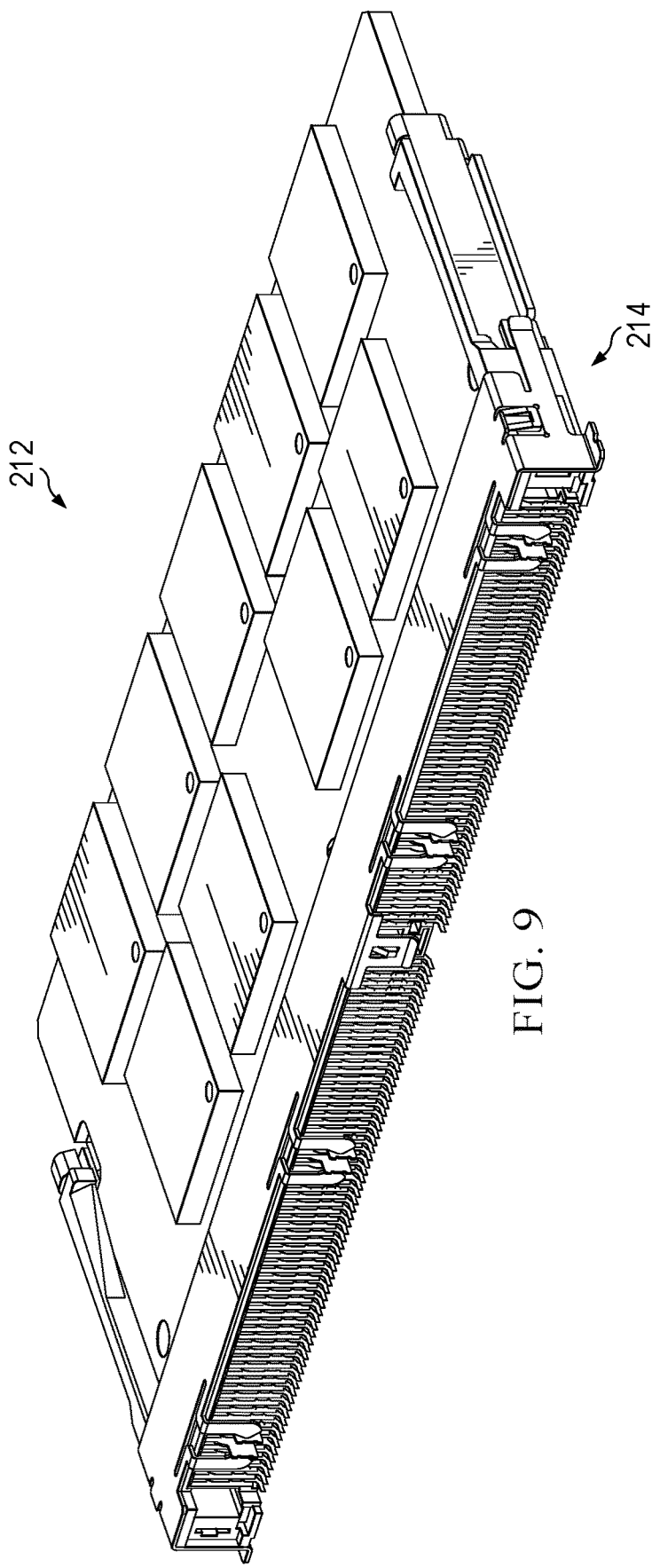
FIG. 9 is a perspective view of a computing card coupled to the socket.

To that end, as shown in FIG. 9, the computing card 212 can be coupled to (or engaged with) the socket 214. The computing card 212 can include gold fingers that couple to (or engage with) the plurality of pins 220. When the computing card 212 is coupled to (or engaged with) the socket 214, the socket 214 provides grounding to the computing card 212. For example, the socket 214 can provide grounding to the computing card 212 through at least the subset of pins 222, the clips 234, the extension shield portion 232, the tab portions 230, and the PCB 240.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A radio frequency (RF) shielding socket, comprising:
   a first tab shield portion on a first side of the socket;
   a second tab shield portion on a second side of the socket, the second side opposite the first side;
   an extension shield portion extending along a first direction between the first tab shield portion and the second tab shield portion, the extension shield portion including a plurality of clips, each of the clips protruding from the extension shield portion in a second direction traverse to the first direction; and
   a plurality of pins positioned on a third side of the socket, the third side extending between the first side and the second side, wherein a subset of the plurality of pins include a tabbed feature protruding from a body of the respective pin, wherein the tabbed feature of each of the subset of the plurality of pins is in contact with at least one of the clips of the plurality of clips.

2. The socket of claim 1, wherein each of the first tab shield portion and the second tab shield portion are coupled to a printed circuit board (PCB).

3. The socket of claim 1, wherein each clip of the plurality of clips includes two prongs.

4. The socket of claim 3, wherein each of the prongs is in contact with the tabbed feature of a single pin of the subset of the plurality of pins.

5. The socket of claim 3, wherein each prong of the two prongs is in contact with the tabbed feature of a respective pin of the subset of the plurality of pins.

6. The socket of claim 3, wherein each of the prongs includes a protrusion, wherein the protrusions of the prongs is in contact with the tabbed feature of the pin of the subset of the plurality of pins.

7. The socket of claim 1, wherein the first tab shield portion, the second tab shield portion, and the extension shield portion are formed of conductive material.

8. The socket of claim 1, wherein the first tab shield portion and the second tab shield portion are spring members.

9. The socket of claim 1, wherein the socket provides grounding to a computing card when the computing card is coupled with the socket.

10. A system, comprising:
    a printed circuit board (PCB);
    a radio frequency (RF) shielding socket coupled to the PCB, including:
      a first tab shield portion on a first side of the socket;
      a second tab shield portion on a second side of the socket, the second side opposite the first side;
      an extension shield portion extending along a first direction between the first tab shield portion and the second tab shield portion, the extension shield portion including a plurality of clips, each of the clips protruding from the extension shield portion in a second direction traverse to the first direction;
      a plurality of pins positioned on a third side of the socket, the third side extending between the first side and the second side, wherein a subset of the plurality of pins include a tabbed feature protruding from a body of the respective pin, wherein the tabbed feature of each of the subset of the plurality of pins is in contact with at least one of the clips of the plurality of clip; and
    a computing card coupled to the socket.

11. The system of claim 10, wherein each of the first tab shield portion and the second tab shield portion are coupled to a printed circuit board (PCB).

12. The system of claim 10, wherein each clip of the plurality of clips includes two prongs.

13. The system of claim 12, wherein each of the prongs is in contact with the tabbed feature of a single pin of the subset of the plurality of pins.

14. The system of claim 12, wherein each prong of the two prongs is in contact with the tabbed feature of a respective pin of the subset of the plurality of pins.

15. The system of claim 12, wherein each of the prongs includes a protrusion, wherein the protrusions of the prongs is in contact with the tabbed feature of the pin of the subset of the plurality of pins.

16. The system of claim 10, wherein the first tab shield portion, the second tab shield portion, and the extension shield portion are formed of a conductive material.

17. The system of claim 10, wherein the first tab shield portion and the second tab shield portion are spring members.

18. The system of claim 10, wherein the socket provides grounding to the computing card when the computing card is coupled with the socket.

* * * * *